(12) United States Patent
Correale, Jr. et al.

(10) Patent No.: US 7,672,188 B2
(45) Date of Patent: Mar. 2, 2010

(54) SYSTEM FOR BLOCKING MULTIPLE MEMORY READ PORT ACTIVATION

(75) Inventors: Anthony Correale, Jr., Raleigh, NC (US); Matthew W. Baker, Holly Springs, NC (US); Benjamin J. Bowers, Cary, NC (US); Michael B. Mitchell, Fuquay-Varina, NC (US); Nishith Rohatgi, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 11/954,791

(22) Filed: Dec. 12, 2007

(65) Prior Publication Data
US 2009/0154283 A1 Jun. 18, 2009

(51) Int. Cl.
*G11C 8/00* (2006.01)
(52) U.S. Cl. .............................. 365/230.05; 365/230.06; 365/189.05
(58) Field of Classification Search ............ 365/230.05, 365/230.06, 230.08, 189.05, 189.15
See application file for complete search history.

(56) References Cited

U.S. PATENT DOCUMENTS 7,280,427 B2 * 10/2007 Shin ...................... 365/230.05

* cited by examiner

*Primary Examiner*—David Lam
(74) *Attorney, Agent, or Firm*—Cantor Colburn LLP; Mark McBurney

(57) ABSTRACT

A system for blocking multiple memory read port activation including a first memory read port word line driver that includes a first polarity hold latch with an output connected to an input of a first buffer, and a second memory read port word line driver that includes a second polarity hold latch with an output connected to an input of a blocking switch and a second buffer with an input connected to an output of the blocking switch, wherein a second input of the blocking switch is also connected to the output of the first polarity hold latch and the blocking switch is configured to allow or block a signal transmission between the input and the output of the blocking switch dependent on a signal assertion of the second input to the blocking switch.

5 Claims, 2 Drawing Sheets

SYSTEM FOR BLOCKING MULTIPLE MEMORY READ PORT ACTIVATION

BACKGROUND OF THE INVENTION

1. Field of the Invention

This invention relates generally to semiconductor memories, and particularly to a system for blocking multiple memory read port activation.

2. Description of Background

The operation of semiconductor memory systems with multiple outputs (or "read ports") for each memory cell can be enhanced by preventing the simultaneous activation of multiple read ports from the same memory cell, which improves performance and/or decreases power consumption. Such enhancements are generally accomplished by detecting data requests from multiple (e.g., two or more) read ports for the same memory location (or "address") and blocking the activation of the control inputs (or "word lines") to the non-preferred read port(s), which are then fed the data from the activated preferred read port through a connecting switch.

However, this detecting (or "comparing") function can limit the performance of such enhanced memory systems, thereby defeating the enhancement benefits. For example, the blocking of multiple word line activation can be delayed as a result of the delay involved with completing the comparing function, which can counteract the improved performance and decreased power consumption benefits. Thus, a more efficient alternative to the comparing function is desirable to further promote the benefits of blocking multiple read port activation from the same memory address.

SUMMARY OF THE INVENTION

A system for blocking multiple memory read port activation is provided. The system includes a first memory read port word line driver that includes a first polarity hold latch with an output connected to an input of a first buffer, and a second memory read port word line driver that includes a second polarity hold latch with an output connected to an input of a blocking switch and a second buffer with an input connected to an output of the blocking switch, wherein a second input of the blocking switch is also connected to the output of the first polarity hold latch and the blocking switch is configured to allow or block a signal transmission between the input and the output of the blocking switch dependent on a signal assertion of the second input to the blocking switch.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

According to exemplary embodiments of the invention described herein, a system for blocking multiple memory read port activation is provided. In accordance with such exemplary embodiments, multiple read port activation from the same memory address is blocked more efficiently without the use of an ancillary compare function.

Figure 1:
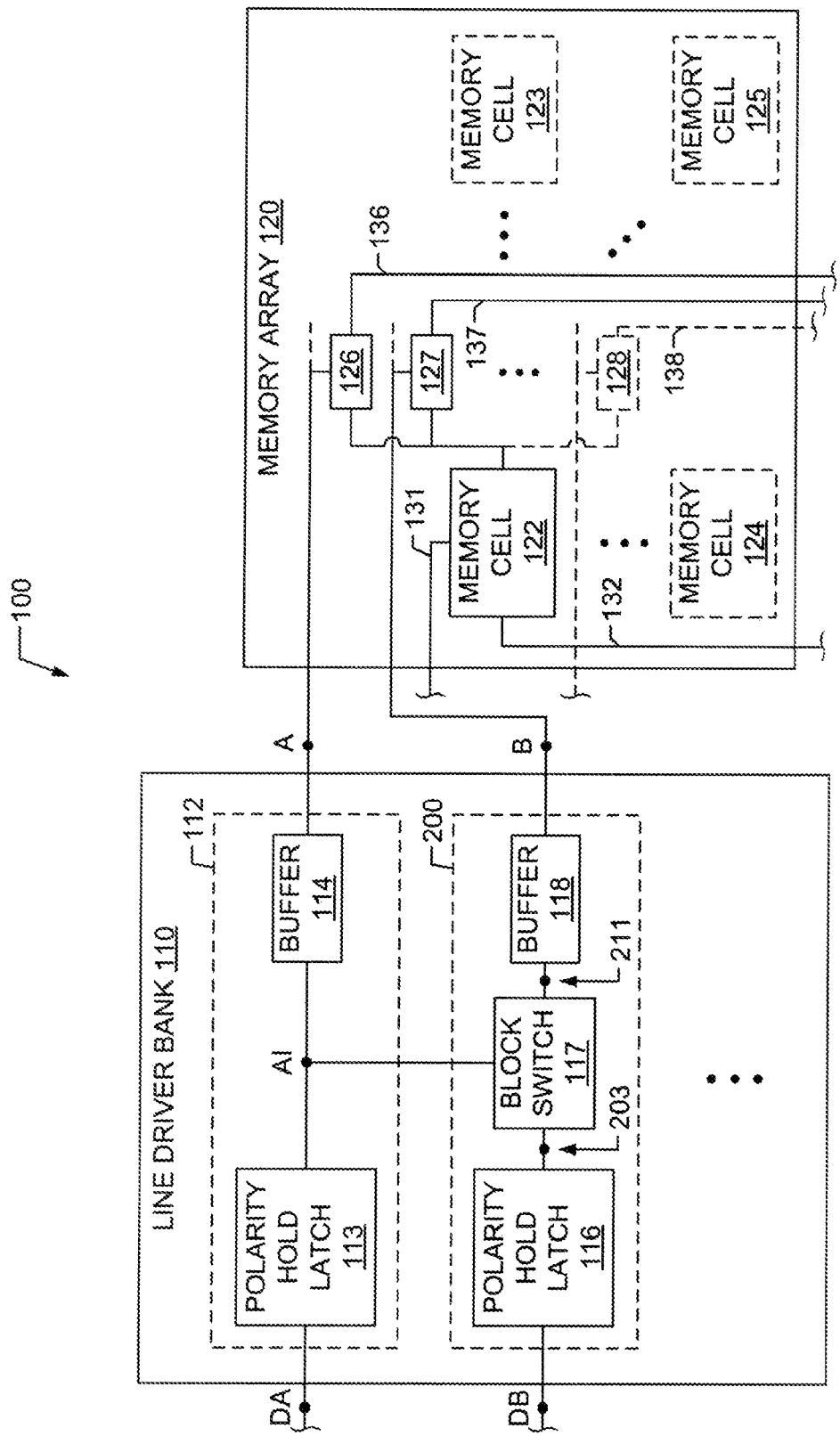
FIG. 1 is a schematic diagram illustrating an example of a line driver bank and memory array of a system for blocking multiple memory read port activation.

Turning now to the drawings in greater detail, wherein like reference numerals indicate like elements, FIG. 1 illustrates an example of a memory read port word line driver ("line driver") bank 110 and memory array 120 of a system 100 for blocking multiple memory read port activation. The exemplary line driver bank 110 includes two or more memory read port word line drivers ("line drivers") 112, 200, which, for example, can be associated with common memory cells. The first line driver 112 includes a polarity hold latch 113 connected to a buffer 114 via internal node AI. Polarity hold latch 113 is connected to a memory read decoder ("read decoder") or other memory control component (not depicted) via input node DA.

The second line driver 200 includes a polarity hold latch 116 connected to a blocking switch 117 via internal node 203 and a buffer 118 connected to the blocking switch 117 via internal node 211. The blocking switch 117 is also connected to the internal node AI. Polarity hold latch 116 is connected to a read decoder or other memory control component (not depicted) via input node DB. Polarity hold latches 113, 116 may include other inputs and/or outputs, including, for example, clock inputs as described below with respect to FIG. 2. Additional line drivers similar to line driver 112 and/or line driver 200 may be included in the line driver bank 110 in some embodiments.

The exemplary memory array 120 includes one or more memory cells 122, 123, 124, 125. Memory cell 122, for example, can include various connections such as a write port word line 131 and a write port data line ("write port") 132. Memory cell 122 is connected to multiple (e.g., two or more) read port data lines ("read ports") 136, 137, 138 via read port activation switches ("read port switches") 126, 127, 128. Buffer 114 is connected to read port switch 126 via node A and may be connected to other read port switches, e.g., within the memory array 120. Buffer 118 is connected to read port switch 127 via node B and may also be connected to other read port switches. Other memory cells, such as memory cells 123-125 may include similar connections. Write port word line 131 may be connected to a memory write decoder or other memory control component (not depicted). Write port 132 and read ports 126-128 may be connected to a processor, input/output module, or other components of a computing device (not depicted).

Figure 2:
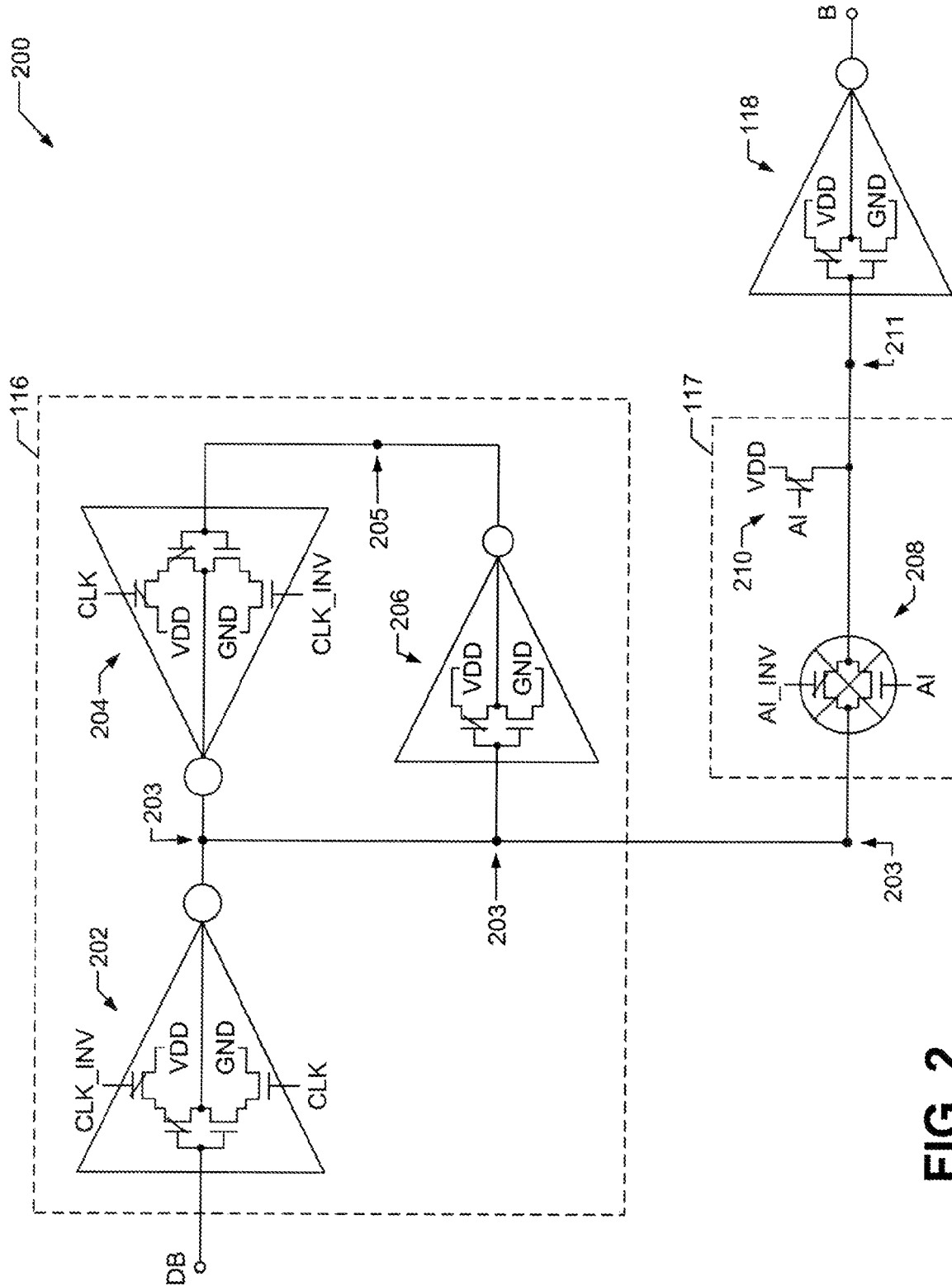
FIG. 2 is a schematic diagram illustrating an example of a line driver in the system for blocking multiple memory read port activation of FIG. 1.

FIG. 2 illustrates an example of the line driver 200 in the system 100 for blocking multiple memory read port activation of FIG. 1. As discussed above, the exemplary line driver 200 includes a polarity hold latch 116, a blocking switch 117, and a buffer 118. Polarity hold latch 116 includes a first clocked or gated inverter 202. This gated inverter 202 can be implemented, e.g., by a plurality of switches, such as complementary metal oxide semiconductor (CMOS) field effect transistors (FETs), connected to a voltage source VDD (e.g., providing a logic-1 signal), a ground GND (e.g., providing a logic-0 signal), a clock signal CLK (e.g., providing a pulse signal between logic-0 and logic 1), and the inverse of the clock signal CLK_INV, as depicted. The input of the first gated inverter 202 is connected to input node DB, and the output of the gated inverter 202 is connected to internal node 203.

Polarity hold latch 116 also includes a second gated inverter 204 that can be implemented, e.g., by the same plurality of switches and connections as described for gated inverter 202, except that the connections of the clock input CLK and inverted clock input CLK_INV are reversed. The output of the second gated inverter 204 is connected to the output of gated inverter 202 via internal node 203. The input of gated inverter 204 is connected to internal node 205.

The polarity hold latch 116 further includes an inverter 206. The inverter 206 can also be implemented by a plurality of switches, such as CMOS FETs, connected to the voltage source VDD and the ground GND as depicted. The input of inverter 206 is connected to internal node 203 and the output of inverter 206 is connected to internal node 205. Thus, inverter 206 is connected within a feedback loop of polarity hold latch 116. The output of polarity hold latch 116 is connected to blocking switch 117 via internal node 203.

Blocking switch 117 includes a transmission gate 208 and a pull-up switch 210. Transmission gate 208 can be implemented, e.g., by a pair of CMOS FETs connected in parallel and also connected to the internal node AI of the first latch 112 and an inverted version of node AI as depicted. The input of transmission gate 208 is connected to internal node 203 and the output is connected to internal node 211.

The pull-up switch 210 is also connected to internal node 211. Pull-up switch 210 can be implemented, e.g., by an FET connected to internal node AI and voltage source VDD as depicted. The output of blocking switch 117 is connected to buffer 118 via internal node 211. Buffer 118 can be implemented by an inverter, like inverter 206 described with respect to polarity hold latch 116, as depicted. The output of buffer 118 is connected to read port word line node B. It is noted that polarity hold latch 113 and buffer 114 of the first line driver 112 can be implemented with the same exemplary configurations described above for polarity hold latch 116 and buffer 118. Furthermore, the inverted versions of node AI and clock input CLK can be obtained by passing the signals thereof through an inverter also like the inverter 206.

In an exemplary operation, a request for the activation of multiple read ports of memory cell 122 is simultaneously received at the line drivers 112, 200 via node DA and node DB respectively from a read decoder (e.g., as a logic-1 signal assertion via a 1-hot bus). In the exemplary embodiments depicted in FIGS. 1 and 2, read port 136 is the primary or preferred read port in the case of such multiple read port requests and, therefore, the activation of the secondary or non-preferred read ports 137, 138, etc. will be blocked for such requests in the following manner. The logic-1 signal input at node DA propagates through polarity hold latch 113 to internal node AI during which it is inverted to a logic-0 signal, while the logic-1 signal input at node DB propagates through polarity hold latch 116 to internal node 203 (during which it is also inverted to a logic-0 signal).

The logic-0 signal at node AI is input to buffer 114 and to blocking switch 117. The logic-0 signal at node AI is inverted back to a logic-1 signal at node A by buffer 114 thereby activating read port switch 126, which in turn activates read port 136 allowing the content (e.g., a data bit) of memory cell 122 to be transmitted to a processor, input/output module, or other components of a computing device. The logic-0 signal at node AI is input to the transmission switch 208 of the blocking switch 117 and an inverted form of node AI ("AI_INV") (i.e., a logic-1 signal) is also input to the transmission switch 208, which places the transmission gate in a non-transmitting or open state thereby blocking the transmission of the logic-0 signal through blocking switch 117. Additionally, the logic-0 signal at node AI is input to pull-up switch 210 causing it to activate (since it is a p-type transistor in this example) and set node 211 to VDD or logic-1.

The logic-1 signal at node 211 is inverted by buffer 118 to a logic-0 signal at node B, and as a result, read port switch 127 is (or remains) deactivated and, therefore, read port 137 is (or remains) deactivated, thereby blocking the simultaneous activation of multiple read ports from memory cell 122. However, the non-preferred read port 137 can be fed the data from memory cell 122 via a switch (not depicted) that can connect the activated preferred read port 136 to the deactivated non-preferred read port 137 to fulfill the initial multiple read port activation request without degrading the performance and/or power consumption benefits obtained by blocking the multiple read port activation via memory cell 122.

By similar operation to the above, when there is a logic-0 signal at node A for deactivation of read port 136 (and thus a logic-1 signal at node AI), transmission gate 208 is activated to a transmitting or closed state and pull-up switch 210 is deactivated. Therefore, blocking switch 117 is in a closed state and a logic-1 or logic-0 signal can propagate from node DB (e.g., via node 203 when the clock inputs CLK, CLK_INV are activated) to node B via blocking switch 117 to activate or deactivate read port 137 via read port switch 127.

As described above, the output of line driver 200 (i.e., via node B) will revert to a non-blocked status when node AI is asserted to logic-1. In a more specific exemplary operation, according to some embodiments, upon a subsequent clock cycle where the content of line driver 112 changes from logic-1 to logic-0 and the content of line driver 200 is an unaltered logic-0 (e.g., non-clocked), a content of memory cell 122 is passed to read port 137 via read port switch 127.

The following table summarizes the operation of the line drivers 112, 200 and read ports 136, 137 in accordance with the above description.

TABLE

Summary of operation of line drivers 112, 200 and read ports 136, 137.

| NODE A | NODE B | READ PORT 136 | READ PORT 137 |
|---|---|---|---|
| LOGIC-1 | SET LOGIC-0 | ACTIVATED | NOT ACTIVATED |
| LOGIC-0 | LOGIC-1 OR LOGIC-0 PER NODE DB (VIA 203) | NOT ACTIVATED | ACTIVATED OR NOT ACTIVATED PER NODE B |

The exemplary system 100 for blocking multiple memory read port activation is illustrated and described with respect to various components, modules, etc. for exemplary purposes. For example, the polarity hold latch 116, blocking switch 117, and buffer 118 of line driver 200 are described to include certain components in certain configurations. However, it should be understood that other variations, combinations, or integrations of such elements that provide the same features, functions, etc. are included within the scope of embodiments of the invention.

The circuit as described above can be part of a design for an integrated circuit chip. This chip design can be created in a graphical computer programming language and stored in a computer storage medium (such as a disk, tape, physical hard drive, or virtual hard drive, such as in a storage access network). If the chip designer does not fabricate chips or the photolithographic masks used to fabricate chips, the designer may transmit the resulting design by physical means (e.g., by providing a copy of the storage medium storing the design) or electronically (e.g., through the Internet) to the corresponding entity, directly or indirectly. The stored design can then be converted into an appropriate format (e.g., GDSII) for the fabrication of photolithographic masks, which typically include multiple copies of the chip design to be formed on a wafer. The photolithographic masks can be utilized to define areas of the wafer (and/or the layers thereon) to be etched or otherwise processed to fabricate chips.

The resulting integrated chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multi-chip package (such as a ceramic carrier that has surface interconnections and/or buried connections). In any case, the chip is then integrated with other chips, discrete circuit elements, and/or other signal processing devices as part of either (a) any intermediate product, such as a motherboard, or (b) an end product. The end product can be any product that includes integrated circuit chips, ranging from toys and other low-end applications to advanced computer products having a display, a keyboard or other input device, and a central processor.

While exemplary embodiments of the invention have been described, it will be understood that those skilled in the art, both now and in the future, may make various improvements and enhancements which fall within the scope of the claims that follow. These claims should be construed to maintain the proper protection for the invention first described.

What is claimed is:

1. A system for blocking multiple memory read port activation, comprising:
   a first memory read port word line driver that includes a first polarity hold latch with an output connected to an input of a first buffer; and
   a second memory read port word line driver that includes a second polarity hold latch with an output connected to an input of a blocking switch and a second buffer with an input connected to an output of the blocking switch;
   wherein a second input of the blocking switch is also connected to the output of the first polarity hold latch and the blocking switch is configured to allow or block a signal transmission between the input and the output of the blocking switch dependent on a signal assertion of the second input to the blocking switch.

2. The system of claim 1, wherein a logic-1 assertion of the first buffer output corresponds to a logic-0 assertion of the second input to the blocking switch, and the blocking switch is further configured to block the signal transmission between the input and the output of the blocking switch in response to the logic-0 assertion of the second input to the blocking switch thereby preventing a simultaneous logic-1 assertion of the first buffer output and the second buffer output.

3. The system of claim 1, wherein a logic-0 assertion of the first buffer output corresponds to a logic-1 assertion of the second input to the blocking switch, and the blocking switch is further configured to pass the signal transmission between the input and the output of the blocking switch in response to the logic-1 assertion of the second input to the blocking switch thereby allowing a logic-1 or logic-0 assertion of the second buffer output dependent on an assertion of the second polarity hold latch output.

4. The system of claim 2, wherein:
   an input of the first polarity hold latch is connected to a first output of a memory read decoder;
   an input of the second polarity hold latch is connected to a second output of the memory read decoder;
   an output of the first buffer is connected to a first read port activation switch of a first read port of a memory cell;
   an output of the second buffer is connected to a second read port activation switch of a second read port of the memory cell; and
   in response to a simultaneous logic-1 assertion of the input of the first polarity hold latch and the second polarity hold latch via the first output and the second output of the memory read decoder respectively, the preventing of a simultaneous logic-1 assertion of the first buffer output and the second buffer output by the blocking switch thereby prevents the activation of the second read port by a logic-1 assertion of the second read port activation switch when the first read port is activated by a logic-1 assertion of the first report activation switch.

5. The system of claim 2, wherein:
   the second polarity hold latch comprises a first gated inverter having an output connected to an output of a second gated inverter, and an inverter having an input connected to the output of the first gated inverter and the output of the second gated inverter and an output connected to an input of the second gated inverter;
   the blocking switch comprises a transmission gate having an output connected to a pull-up switch, wherein the transmission gate is deactivated and the pull-up switch is activated by the logic-0 assertion of the second input to the blocking switch, thereby setting the output of the blocking switch to a logic-1 assertion; and
   the buffer comprises an inverter.

* * * * *